United States Patent
Xiao et al.

(10) Patent No.: US 8,193,027 B2
(45) Date of Patent: Jun. 5, 2012

(54) METHOD OF MAKING A MULTICOMPONENT FILM

(75) Inventors: Manchao Xiao, San Diego, CA (US); Liu Yang, Yorba Linda, CA (US); Xinjian Lei, Vista, CA (US); Iain Buchanan, Stirling (GB)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 13/023,145

(22) Filed: Feb. 8, 2011

(65) Prior Publication Data

US 2012/0034767 A1    Feb. 9, 2012

Related U.S. Application Data

(60) Provisional application No. 61/307,222, filed on Feb. 23, 2010.

(51) Int. Cl.
 *H01L 21/00* (2006.01)
 *H01L 21/06* (2006.01)
 *H01L 21/44* (2006.01)
 *H01L 21/469* (2006.01)

(52) U.S. Cl. ............ 438/84; 438/95; 438/102; 438/681; 438/762; 438/765; 257/E21.068; 257/E21.17

(58) Field of Classification Search ............. 257/E21.17, 257/E21.068
See application file for complete search history.

(56) References Cited

U.S. PATENT DOCUMENTS

| | | | |
|---|---|---|---|
| 6,602,549 B1 * | 8/2003 | Baum et al. | 427/252 |
| 7,390,715 B2 | 6/2008 | Ou et al. | |
| 7,854,963 B2 * | 12/2010 | Basol | 427/383.1 |
| 2009/0253270 A1 | 10/2009 | Lavoie et al. | |
| 2010/0009078 A1 * | 1/2010 | Pore et al. | 427/255.28 |

FOREIGN PATENT DOCUMENTS

EP    2 130 942 A2    12/2009

OTHER PUBLICATIONS

T. Hatanpaa, et al, Alkylsilyl Compounds of Selenium and Tellurium: New Precursors for ALD, The Electrochemical Society, 2009, 609-616.

* cited by examiner

*Primary Examiner* — Mohsen Ahmadi
(74) *Attorney, Agent, or Firm* — Rosaleen P. Morris-Oskanian

(57) ABSTRACT

Described herein is a method and liquid-based precursor composition for depositing a multicomponent film. In one embodiment, the method and compositions described herein are used to deposit Germanium Tellurium (GeTe), Antimony Tellurium (SbTe), Antimony Germanium (SbGe), Germanium Antimony Tellurium (GST), Indium Antimony Tellurium (IST), Silver Indium Antimony Tellurium (AIST), Cadmium Telluride (CdTe), Cadmium Selenide (CdSe), Zinc Telluride (ZnTe), Zinc Selenide (ZnSe), Copper indium gallium selenide (CIGS) films or other tellurium and selenium based metal compounds for phase change memory and photovoltaic devices.

10 Claims, 4 Drawing Sheets

METHOD OF MAKING A MULTICOMPONENT FILM

CROSS REFERENCE TO RELATED APPLICATIONS

This patent application claims the benefit of prior U.S. Provisional Patent Application Ser. No. 61/307,222 filed Feb. 23, 2010.

BACKGROUND OF THE INVENTION

Disclosed herein is a method for depositing multicomponent films each of which may be stoichiometric or non-stoichiometric such as, but not limited to, Germanium Tellurium (GeTe), Antimony Tellurium (SbTe), Antimony Germanium (SbGe), Germanium Antimony Tellurium (GST), Indium Antimony Tellurium (IST), Silver Indium Antimony Tellurium (AIST), Cadmium Telluride (CdTe), Cadmium Selenide (CdSe), Zinc Telluride (ZnTe), Zinc Selenide (ZnSe), Copper indium gallium selenide (CIGS). The method described herein may, in certain embodiments, be used to deposit the multicomponent films as an alternative to existing vapor phase deposition methods such as physical vapor deposition (PVD), chemical vapor deposition (CVD) or atomic layer deposition (ALD). Liquid-based precursor compositions or mixtures thereof for depositing the multicomponent film using the method described herein are also contemplated.

Certain alloys such Cadmium Telluride, Cadmium Selenide, and Copper indium gallium selenide (CIGS) are of industrial interest because they can be used as photovoltaic materials. Still other alloys including, but not limited to, GST (Germanium Antimony Tellurium alloy), IST (Indium Antimony Tellurium), and AIST (Silver Indium Antimony Tellurium), are used to fabricate electronic devices, including Phase Change Random Access Memory (PCRAM). Phase-change materials exist in a crystalline state or an amorphous state according to temperature. A phase-change material has a more ordered atomic arrangement and a lower electrical resistance in a crystalline state than in an amorphous state. A phase-change material can be reversibly transformed from the crystalline state to the amorphous state based on an operating temperature. Such characteristics, that is, reversible phase change and different resistances of different states, are applied to newly proposed electronic devices, a new type of nonvolatile memory devices, phase-change random access memory (PCRAM) devices. The electrical resistance of a PCRAM may vary based on a state (e.g., crystalline, amorphous, etc.) of a phase-change material included therein.

Among various types of phase-change materials used for memory devices, the most commonly used are ternary chalcogenides of Group 14 and Group 15 elements, such as Germanium Antimony Tellurium compounds of various compositions, including but not limited to $Ge_2Sb_2Te_5$, commonly abbreviated as GST. The solid phases of GST can rapidly change from crystalline state to amorphous state or vise versa upon heating and cooling cycles. The amorphous GST has relatively higher electrical resistance while the crystalline GST has relatively lower electrical resistance.

One of the technical hurdles in designing a PCRAM cell is that in order to overcome the heat dissipation during the switching of GST materials from crystalline to amorphous states a high level of reset current has to be applied. This heat dissipation, however, can be greatly reduced by confining GST material into contact plugs, thus reducing the reset current needed for the action. The GST contact plugs are of high aspect ratio structure, and conventional sputtering process for GST film deposition can not achieve high conformality required. This drives the need for precursors and related manufacturing methods or processes for forming GST films which can produce films with high conformality and chemical composition uniformity.

BRIEF SUMMARY OF THE INVENTION

The method described herein provides an alternative to existing PVD, CVD or ALD depositions for depositing multicomponent films. Liquid-based precursor compositions or solutions comprising one or more precursors for depositing the multicomponent film using the method described herein are also contemplated. Compared to the existing technologies, the method described herein may achieve at least one of the following objectives: are environmentally friendly, consume less precursor material, provide coverage for high aspect ratio features, and/or require less energy for producing the film. The foregoing advantages may result in lower costs in depositing the film. It is believed that films deposited by the method described herein can be used, for example, in the following applications: in semiconductor memory, solar cell technology, infrared sensors and/or devices.

One embodiment of the method for depositing a multicomponent film onto at least a portion of a substrate comprises the steps of:
(a) contacting the substrate with a Ge precursor or a precursor solution comprising the Ge precursor to react with the substrate to provide a first coating layer comprising Ge;
(b) rinsing at least a portion of the first coating layer with a rinse solution comprising a solvent to remove any unreacted Ge precursor;
(c) contacting the first coating layer comprising Ge with a Te precursor or a precursor solution comprising the Te precursor, wherein at least a portion of the Te precursor reacts with at least a portion of the Ge comprised therein to provide a second coating layer comprising Ge and Te;
(d) rinsing at least a portion of the second coating layer with rinse solution comprising a solvent to remove any unreacted Te precursor;
(e) contacting the second coating layer comprising Ge and Te with a Sb precursor or a precursor solution comprising the Sb precursor, wherein at least a portion of the Sb precursor reacts with at least a portion of the Ge and Te comprised therein to provide a third coating layer comprising Ge, Te, and Sb;
(f) rinsing at least a portion of the third coating layer with rinse solution comprising a solvent to remove any unreacted Sb precursor;
(g) contacting the third coating layer comprising Ge, Te, and Sb with a Te precursor or a precursor solution comprising the Te precursor, wherein at least a portion of the Te precursor reacts with at least a portion of the Ge and Sb comprised therein to provide a fourth coating layer comprising Ge, Te, and Sb; and
(h) rinsing at least a portion of the fourth coating layer with rinse solution comprising a solvent to remove any unreacted Te precursor.

In certain embodiments, steps (a) through (h) are repeated a number of times until a desired thickness of coating layers is reached to provide the multicomponent film. In this or other embodiment, the steps may be performed in the order of:

e→f→g→h→a→b→c→d.

In a further embodiment, there is provided a process of depositing a multicomponent film onto at least a portion of a substrate comprising the steps of:

(a) contacting the substrate with an In precursor or a precursor solution comprising the In precursor to react with the substrate to provide a first coating layer comprising In;

(b) rinsing at least a portion of the first coated layer with a rinse solution to remove any unreacted In precursor;

(c) contacting the first coating layer comprising In with a Te precursor or a precursor solution comprising the Te precursor, wherein at least a portion of the Te precursor reacts with the In comprised therein to provide a second coating layer comprising In and Te;

(d) rinsing at least a portion of the second coating layer with rinse solution to remove any unreacted Te precursor;

(e) contacting the second coating layer comprising In and Te with a Sb precursor or a precursor solution comprising the Sb precursor, wherein at least a portion of the Sb precursor reacts with at least a portion of the In and Te comprised therein to provide a third coating layer comprising In, Sb, and Te;

(f) rinsing at least a portion of the third coating layer with rinse solution to remove any unreacted Sb precursor, (g) contacting the third coating layer comprising In, Te, and Sb with a Te precursor or a precursor solution comprising the Te precursor to provide a fourth coating layer comprising In, Te, and Sb; and (h) rinsing at least a portion of the fourth coating layer with rinse solution to remove any unreacted Te precursor, (i) contacting the fourth coating layer comprising In, Te, and Sb with a Ag precursor or a precursor solution comprising the Ag precursor, wherein at least a portion of the Ag precursor reacts with at least a portion of the In, Te, and Sb comprised therein to provide a fifth coating layer comprising In, Te, Sb and Ag;

(j) rinsing at least a portion of the fifth coating layer with rinse solution to remove any unreacted Ag precursor;

(k) contacting the fifth coating layer comprising In, Te, Sb and Ag with a Te precursor or a precursor solution comprising the Te precursor to react with the fifth coating layer to provide a sixth coating layer comprising In, Te, Sb and Ag; and (l) rinsing at least a portion of the sixth coating layer with rinse solution to remove any unreacted Te precursor, wherein steps (a) through (l) are repeated to form a number of coating layers to provide the film.

In yet another embodiment, there is provided a method of depositing a multicomponent film on a substrate comprising steps of:

(a) contacting the substrate with an In precursor or a precursor solution comprising the In precursor to react with the substrate to provide a first coating layer comprising In;

(b) rinsing at least a portion of the first coated layer with a rinse solution to remove any unreacted In precursor;

(c) contacting the first coating layer comprising In with a Te precursor or a precursor solution comprising the Te precursor, wherein at least a portion of the Te precursor reacts with the In comprised therein to provide a second coating layer comprising In and Te;

(d) rinsing at least a portion of the second coating layer with rinse solution to remove any unreacted Te precursor;

(e) contacting the second coating layer comprising In and Te with a Sb precursor or a precursor solution comprising the Sb precursor, wherein at least a portion of the Sb precursor reacts with at least a portion of the In and Te comprised therein to provide a third coating layer comprising In, Sb, and Te;

(f) rinsing at least a portion of the third coating layer with rinse solution to remove any unreacted Sb precursor, (g) contacting the third coating layer comprising In, Te, and Sb with a Te precursor or a precursor solution comprising the Te precursor to react with the third layer to provide a fourth coating layer comprising In, Te, and Sb; and (h) rinsing at least a portion of the fourth coating layer with rinse solution to remove any unreacted Te precursor, wherein steps (a) through (h) are repeated to form a number of coating layers to provide the film.

In a still further embodiment, there is provided a method for depositing a film on at least a portion of a substrate comprising the steps of:

(a) contacting the substrate with a Cd precursor or a precursor solution comprising the Cd precursor to react with the substrate to provide a first coating layer comprising Cd;

(b) rinsing at least a portion of the first coating layer with a rinse solution comprising a solvent or mixed solvent to remove any unreacted Cd precursor;

(c) contacting the first coating layer comprising Cd with a Te precursor or a precursor solution comprising the Te precursor, wherein at least a portion of the Te precursor reacts with at least a portion of the Cd comprised therein to provide a second coating layer comprising Cd and Te;

(d) rinsing at least a portion of the second coating layer with rinse solution comprising a solvent to remove any unreacted Te precursor, wherein steps (a) through (d) are repeated to form a number of coating layers to provide the film.

In yet a further embodiment, there is provided a method of depositing a multicomponent film on at least a portion of a substrate comprising the steps of:

(a) contacting the substrate with a Sb precursor or a precursor solution comprising the Sb precursor to react with the substrate to provide a first coating layer comprising Sb;

(b) rinsing at least a portion of the first coated layer with a rinse solution to remove any unreacted Sb precursor;

(c) contacting the first coating layer comprising Sb with a Te precursor or a precursor solution comprising the Te precursor, wherein at least a portion of the Te precursor reacts with the Sb comprised therein to provide a second coating layer comprising Sb and Te;

(d) rinsing at least a portion of the second coating layer with rinse solution to remove any unreacted Te precursor;

(e) contacting the second coating layer comprising Sb and Te with a Ge precursor or a precursor solution comprising the Ge precursor, wherein at least a portion of the Ge precursor reacts with at least a portion of the Sb and Te comprised therein to provide a third coating layer comprising Ge, Te, and Sb;

(f) rinsing at least a portion of the third coating layer with rinse solution to remove any unreacted Ge precursor;

(g) contacting the third coating layer comprising Sb, Te, and Ge with a Te precursor or a precursor solution comprising the Te precursor to react with the third coating layer to provide a fourth coating layer comprising Sb, Te, and Ge; and (h) rinsing at least a portion of the fourth coating layer with rinse solution to remove any unreacted Te precursor, wherein steps (a) through (h) are repeated to form a number of coating layers and provide the film.

In a further embodiment, there is provided a method of depositing a multicomponent film onto at least a portion of a substrate comprising the steps of:
  (a) contacting the substrate with an Ge precursor or a precursor solution comprising the Ge precursor to react with the substrate to provide a first coating layer comprising Ge;
  (b) rinsing at least a portion of the first coated layer with a rinse solution to remove any unreacted Ge precursor;
  (c) contacting the first coating layer comprising Ge with a Sb precursor or a precursor solution comprising the Sb precursor, wherein at least a portion of the Sb precursor reacts with at least a portion of the Sb comprised therein to provide a second coating layer comprising Ge and Sb;
  (d) rinsing at least a portion of the second coating layer with rinse solution to remove any unreacted Sb precursor,
wherein steps (a) through (d) are repeated to form a number of coating layers to provide the film.

In yet another embodiment the present invention is a method of depositing a multicomponent film onto at least a portion of a substrate comprising steps of:
  (a) contacting the substrate with a $MX_n$ wherein M is a metal or metalloid selected from the group consisting of: Ge, Sb, In, Sn, Ga, Bi, Ag, Cu, Zr, Hf, Hg, Cd, Zn, Ru, Rh, Pd, Os, Ir, Pt and Au; and X is neucleophilic group selected from the group consisting of: OR (alkoxy), F (fluorine), Cl (chlorine), Br (bromine), $NR_2$ (amino), CN (cyano), OCN (cyanate), SCN (thiocyanate), diketonate, and carboxylic groups;
  (b) rinsing at least a portion of the first coated layer with a rinse solution to remove any unreacted precursor;
  (c) contacting the first coating layer comprising an organosilyl precursor or a precursor solution;
  (d) rinsing at least a portion of the second coating layer with rinse solution to remove any unreacted precursor,
wherein steps (a) through (d) are repeated to form a number of coating layers to provide the film and the metal or metalloid can be selected independently from step to step.

In the any of the preceding embodiments, it is understood that the steps of the methods described herein may be performed in a variety of orders, may be performed sequentially or concurrently (e.g., during at least a portion of another step), and any combination thereof. In certain embodiments, the steps described herein are performed sequentially to avoid formation of precipitation.

DETAILED DESCRIPTION OF THE INVENTION

Figure 1:
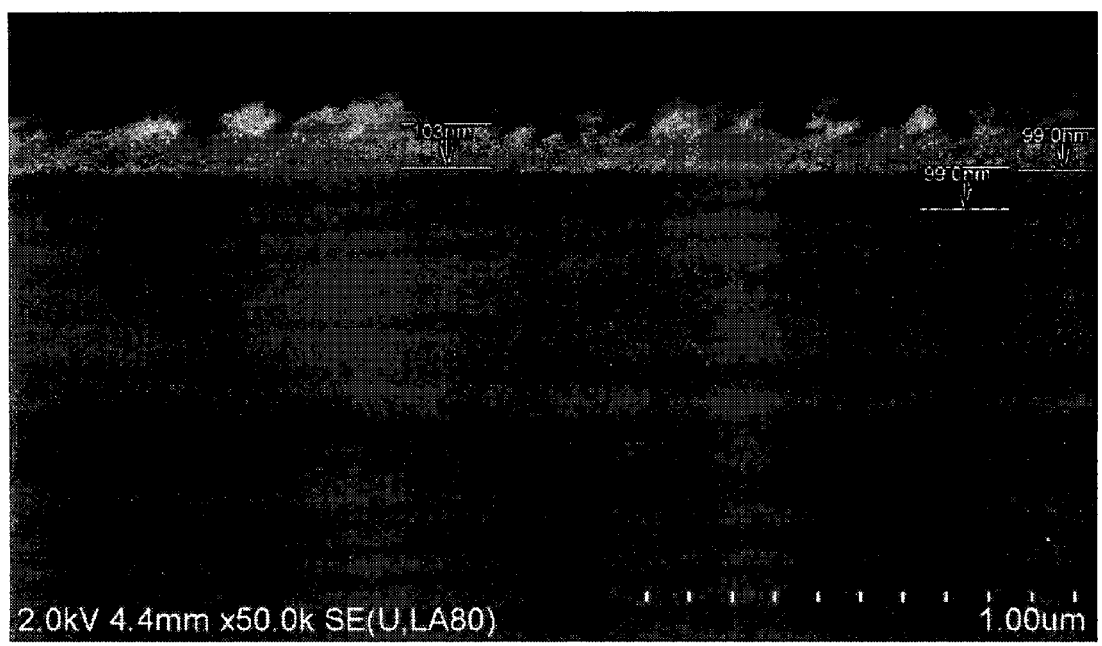
FIG. 1 provides a cross-sectional view obtained by Scanning Electron Microscopy (SEM) of a GST film deposited using the liquid-based deposition method described herein on a Si (100) substrate.

To fabricate high density electronic devices such as phase change memory (PCRAM) or photovoltaic materials, Atomic Layer Deposition (ALD) is a preferred technology to deposit films, such as metal chalcogenide films, uniformly on small dimensional structures on a substrate surface. In certain embodiments, the film comprises a metal chalcogenide film. The term "metal chalcogenide" as used herein refers to a film that contains one or more Group 16 ion (chalcogenide) and at least one electropositive element. Examples of chalcogenide materials include, but are not limited to, sulfides, selenides, and tellurides. Conventional ALD technology involves ALD reactors which typically operate under vacuum and at elevated temperature. It also requires that the precursors be volatile and thermally stable compounds in order to be delivered to the reactor chamber in the vapor phase. ALD is a type of chemical vapor deposition that is used for highly controlled deposition of thin films. It is a self-limiting (the amount of film material deposited in each reaction cycle is constant), sequential process (the precursor vapors are brought onto the substrates alternately, one at a time, separated by purging periods with inert gas). ALD is considered as one deposition method with the greatest potential for producing very thin, conformal films with control of the thickness and composition of the films possible at the atomic level. Using ALD, film thickness depends only on the number of reaction cycles, which makes the thickness control accurate and simple.

By contrast, the method described herein is a liquid-phase layer deposition wherein each exposure of the substrate to a liquid precursor composition results in formation of about one atomic layer. The precursor used to form the coating layer is liquid-based, is in its liquid phase or in a solution with one or more solvents that is liquid-based, and has one or more attributes of a liquid such as but not limited to viscosity, flowability, wetting, compressability and the like. The method described herein provides an alternative to conventional ALD technology by depositing the multicomponent films in ALD manner in the liquid phase to generate high purity films at low temperature such as, for example, at ambient temperature. In the method described herein, the growth of the film is restricted by the chemistry of the precursor liquid in a self limiting surface reaction. Each deposition of the liquid-based precursor or a solution thereof onto the surface may yield about one atomic layer which may be described herein as a coating layer.

In certain embodiments, the method described herein uses one or more precursors that comprise a nucleophilic reagent. In this or other embodiments, organosilyl compounds of Sb, Te and Se will react with nucleophilic reagents to form elemental Sb, Te or Se respectively by the elimination reaction between the organosilyl and nucleophilic groups, and subsequent decomposition of the hydrido compounds of Sb, Te or Se so formed. The nucleophilic reagent may comprise, but is not limited to, water, alcohols, hydrogen halide, or combinations thereof. Examples of this embodiment is illustrated in the following Equations (1) and (2):

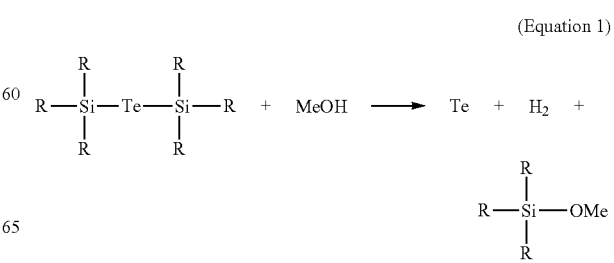

(Equation 1)

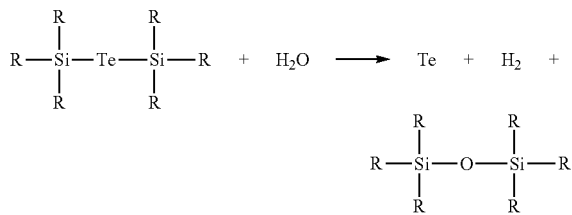

(Equation 2)

In the above equations 1 and 2, R may be, but is not limited to, a methyl ("Me") group, an ethyl ("Et") group, a vinyl ("Vi") group, a phenyl ("Ph") group, or a H atom.

In other embodiments, the nucleophilic reagent may comprise a metal atom bonded to the nucleophilic group. Ligand exchange reactions of Sb, Te and Se organosilyl precursors with a series of metal precursors having nucleophilic substituents can be used to form metal alloys. In one particular embodiment, ligand exchange reactions of silyl-chalcogens, such as organosilyltellurium or silyltellurium, organosilylselenium or silylselenium with a series of metal compounds having neucleophilic substituents generate metal chalcogenides. Because of this, binary, ternary, and multi-element metal tellurides and selenides containing films can be prepared using these methods. An example of this embodiment is illustrated in the following Equations (3) and (4);

$$3\ R_3Si\text{—}Te\text{—}SiR_3 + 2\ SbX_3 \rightarrow Sb_2Te_3 + 3\ R_3Si\text{—}X \quad \text{(Equation 3)}$$

$$2\ R_3Si\text{—}Te\text{—}SiR_3 + GeX_4 \rightarrow Ge_2Te + 4\ R_3Si\text{—}X \quad \text{(Equation 4)}$$

In the above equations 3 and 4, R may be, but is not limited to, a methyl ("Me") group, an ethyl ("Et") group, a vinyl ("Vi") group, a phenyl ("Ph") group, or a H atom; and X a nucleophilic group which may be, but is not limited to, an alkoxide, an amide, a halide.

While not being bound to theory, the method described herein is based on the discovery that exposing a substrate such as a silicon wafer to sequential treatments with one or more precursor liquids, solutions or suspensions (referred to herein as "liquid precursor" or "precursor solution") results in the deposition of good quality films suitable for use in manufacturing. The sequential treatment with liquid precursors may be considered a novel extension of the vapor phase technique known as Atomic Layer Deposition but, whereas ALD is performed in vapor phase, the method described herein is performed in liquid phase.

In one embodiment, the method described herein may comprise a plurality of liquid precursors which are designated as the $1^{st}$ or the $2^{nd}$ liquid precursor which are independently deposited onto the substrate surface in the following sequence:

→$1^{st}$ liquid precursor→$2^{nd}$ liquid precursor→(repeat)

This above sequence or cycle may be repeated multiple times in order to build up a film of desired thickness consisting of a plurality of coating layers. Individual cycles are self limiting—exposure to a liquid precursor causes absorption of the precursor onto the surface up to a saturation level which cannot be exceeded, and exposure to the $2^{nd}$ liquid fully converts the absorbed layer. The sequence is therefore a self limiting surface reaction and confers the benefits of perfect conformality and precise thickness control.

In this or other embodiments, the method described herein may be modified by adding rinse steps between exposures to the one or more precursor liquids in order to remove excess precursor from the substrate surface and thereby ensure that a self limited surface reaction occurs. An example of this embodiment is shown as follows:

→$1^{st}$ liquid precursor→rinse→$2^{nd}$ liquid precursor→rinse→(repeat)

In this embodiment or in a further embodiment, the above sequence or cycle may further be modified by adding an additional precursor liquid exposure step or exposure to $3^{rd}$ liquid precursor in order to deposit a ternary or higher order film. An example of this embodiment is shown as follows:

→$1^{st}$ liquid precursor→rinse→$2^{nd}$ liquid precursor→rinse→$3^{rd}$ liquid precursor→rinse→(repeat)

In one particular embodiment for depositing a GST film, the GST film may be deposited using the following sequence:

→Ge liquid precursor→rinse→Te liquid precursor→rinse→Sb liquid precursor→rinse→Te liquid precursor→rinse→(repeat)

In this sequence, the substrate surface is first saturated with the Ge precursor to react with the substrate surface to provide a first coating layer, and any excess Ge precursor is removed in the rinse. Next, the Te precursor is allowed to react with the Ge on the surface to provide a second coating layer and any excess Te precursor is rinsed off to leave a saturated surface concentration of Te. Then, the Sb precursor is introduced and reacts with the surface Te to form a saturated covering of Sb or a third coating layer, which is then rinsed to remove any excess Sb precursor. The substrate is then subjected to an additional treatment with the Te precursor, which reacts with the Sb-saturated surface to provide a Te covering or additional coating layer, which is rinsed to remove any excess Te precursor. As with the previous embodiments, the entire sequence or cycle can be repeated multiple times thereby forming multiple coating layers to achieve the desired film thickness. It is understood that the method described herein can include any number of orders of introducing the Te, Sb, and Ge precursors and is not limited thereto.

In certain embodiments, alloys incorporating a combination of more than one of the elements Sb, Te and Se may be formed by using more than one sequence based on the method described herein. For example, an alloy containing both Sb and Te could be formed by using organosilyl compounds of both Sb and Te along with a nucleophilic reagent as previously defined. However, in other embodiments it is not necessary that either one or both Sb and Te precursors comprise organosilyl substituents. In one particular embodiment, the Te precursor comprises an organosilyltellurium compound and the Sb precursor comprises a compound in which the Sb atom is already attached to a nucleophilic substituent.

The method described herein may also use—in certain embodiments—silylchalcogens, such as silyltellurium and silylselenium compounds as precursors for tellurium and selenium sources, which react with metal compounds having nucleophilic substituents to form metal tellurides and metal selenides. Ternary and quaternary telluride and selenide films can be made by adding one or more additional precursors, or precursor solutions comprising same, in a sequential manner or in a mixed manner, in a process similar to an ALD process. The material and the technologies disclosed herein can be used for the deposition of GST films or other metal chalcogenide films for phase change memory applications, and various thin films in photovoltaic devices.

Examples of tellurium precursors or Te precursors may comprise disilyltellurium, silylalkyltellurium, or compounds having the general structures of: $(R^1R^2R^3Si)_2Te$ and $(R^1R^2R^3Si)R^4Te$. Examples of Selenium or Se precursors may comprise disilylselenium, silylalkylselenium, or compounds having the general structures of: $(R^1R^2R^3Si)_2Se$ or $(R^1R^2R^3Si)R^4Se$. In the foregoing formulas, substituents $R^1$, $R^2$, $R^3$, and $R^4$ are each independently: hydrogen; linear, branched, or unsaturated $C_{1-10}$ alkyl groups; and $C_{4-10}$ cyclic alkyl groups, or $C_{4-12}$ aromatic groups. The term "alkyl" as used herein is selected from the group consisting of: linear, branched, or unsaturated $C_{1-10}$ alkyl groups; and $C_{4-10}$ cyclic alkyl groups, preferably from 1 to 6 carbon atoms, more preferably from 1 to 3 carbon atoms, alternately from 3 to 5 carbon atoms, further alternately from 4 to 6 carbons atoms, or variations of the foregoing ranges. Exemplary alkyl groups include, but are not limited to, methyl, ethyl, n-propyl, isopropyl, n-butyl, isobutyl, sec-butyl, tert-butyl, tert-amyl, n-pentyl, n-hexyl, cyclopentyl, and cyclohexyl. The term "alkyl" applies also to alkyl moieties contained in other groups such as haloalkyl, alkylaryl, or arylalkyl. In certain embodiments, some of the groups discussed herein may be substituted with one or more other elements such as, for example, a halogen atom or other heteroatoms such as O, N, Si, or S.

Examples for the silyltellurium precursor include, but are not limited to, bis(trimethylsilyl)tellurium, bis(dimethylsilyl)tellurium, bis(triethylsilyl)tellurium, bis(diethylsilyl)tellurium, bis(phenyldimethylsilyl)tellurium, bis(t-butyldimethylsilyl)tellurium, dimethylsilylmethyltellurium, dimethylsilylphenyltellurium, dimethylsilyl-n-butyltellurium, dimethylsilyl-t-butyltellurium, trimethylsilylmethyltellurium, trimethylsilylphenyltellurium, trimethylsilyl-n-butyltellurium, and trimethylsilyl-t-butyltellurium.

The deposited films are selected from the group selected from Germanium Tellurium (GeTe), Antimony Tellurium (SbTe), Antimony Germanium (SbGe), Germanium Antimony Tellurium (GST), Indium Antimony Tellurium (IST), Silver Indium Antimony Tellurium (AIST), Cadmium Telluride (CdTe), Cadmium Selenide (CdSe), Zinc Telluride (ZnTe), Zinc Selenide (ZnSe), Copper indium gallium selenide (GIGS).

In certain embodiments, the method described herein or the liquid precursor comprises one or more metal compounds have the general formula of:

$$MX_n$$

where M is the metal selected from the periodic table of elements, including but not limited to: Ge, Sb, In, Sn, Ga, Bi, Ag, Cu, Zr, Hf, Hg, Cd, Zn and noble metals; and X is neucleophilic group such as OR (alkoxy), F (fluorine), Cl (chlorine), Br (bromine), $NR_2$ (amino), CN (cyano), OCN (cyanate), SCN (thiocyanate), diketonate, or carboxylic groups. In certain embodiments, the M comprises In and is used to deposit an AIST film. In this or other embodiment, the M comprises Ag and is also used to deposit an AIST film.

In certain embodiments wherein the liquid precursor comprises a Ge precursor, examples of Ge compounds include but are not limited to:

$(R^1O)_4Ge$ or $(R^1O)_nGeX_{4-n}$ where $R^1$ is an alkyl group with 1 to 10 carbon chain, branched, cyclic, or aromatic group; and n=1 to 3; X is H, or nucleophilic groups such as F (fluorine), Cl (chlorine), Br (bromine), $NR_2$ (amino), CN (cyano), OCN (cyanate), SCN (thiocyanate), diketonate, or carboxylic groups, or a combination thereof.

$(R^5R^6N)_4Ge$ or $(R^5R^6N)_{4-n}GeX_n$, where $R^5$ and $R^6$ are each independently alkyl groups with 1 to 10 carbons in chain, branched, cyclic, or aromatic group; and n=1 to 3;

X is H, or nucleophilic groups such as OR (alkoxy), F (fluorine), Cl (chlorine), Br (bromine), CN (cyano), OCN (cyanate), SCN (thiocyanate), diketonate, or carboxylic groups or a combination thereof, and $GeX_4$, $GeX_2$, or $R_nGeX_{4-n}$, where X is nucleophilic groups such as OR (alkoxy), F (fluorine), Cl (chlorine), Br (bromine), $NR_2$ (amino), CN (cyano), OCN (cyanate), SCN (thiocyanate), diketonate, or carboxylic groups or a combination thereof, R is hydrogen; linear, branched, or unsaturated $C_{1-10}$ alkyl groups; and $C_{4-10}$ cyclic alkyl groups or $C_{4-12}$ aromatic groups; and n=0-3.

In certain embodiments wherein the liquid precursor comprises a Sb precursor, examples of Sb compounds include, but are not limited to:

$(R^7O)_3Sb$, where $R^7$ is linear, branched, or unsaturated $C_{1-10}$ alkyl groups; or $C_{4-10}$ cyclic alkyl groups;

$(R^7R^8N)_3Sb$, where $R^7$ and $R^8$ are individually linear, branched, or unsaturated $C_{1-10}$ alkyl groups; and $C_{4-10}$ cyclic alkyl groups; and antimony halides with the general formula: $SbX_3$ and $SbX_5$, where X is F, Cl, or Br.

While not being bound by theory, it is believed that silicon-tellurium bonds and silicon-selenium bonds are highly reactive toward nucleophilic attack due to their high degree of ionic character and low bond energy. When these compounds react, for example, with the metal compound $MX_n$, the silyl groups may combine with the electronegative ligands X to form stronger bonds which results in the formation of metal-tellurium bonds and metal-selenium bonds. Studies shows the chemical bond reactivity on the silicon atom has the following order. The bond with high reactivity can be readily converted to the one with low reactivity. The chemical bond reactivity from high activity to low activity is shown below:

Si—Te>Si—I>Si—Se>Si—S>Si—Br>Si—Cl>Si—CN>Si—NCS>Si—O>Si—F

The formation of a metal telluride film using the method described herein can be demonstrated by the following exemplary reactions amongst precursor compounds:

$Me_3Si$—Te—$SiMe_3$+$M(OR)_n$→$MTe$+$Me_3SiOR$ $Me_3Si$—Te—$SiMe_3$+$M(F)_n$→$MTe$+$Me_3SiF$ $Me_3Si$—Te—$SiMe_3$+$M(NR_2)_n$→$MTe$+$Me_3SiNR_2$

The formation of a metal selenide film using the method described herein can be demonstrated by the following exemplary reactions amongst precursor compounds:

$Me_3Si$—Se—$SiMe_3$+$M(OR)_n$→$MSe$+$Me_3SiOR$ $Me_3Si$—Se—$SiMe_3$+$M(F)_n$→$MSe$+$Me_3SiF$ $Me_3Si$—Se—$SiMe_3$+$M(NR_2)_n$→$MSe$+$Me_3SiNR_2$

The formation of a GST using the method described herein can be demonstrated by the following exemplary reactions amongst precursor compounds:

$Me_3Si$—Te—$SiMe_3$+$Ge(OMe)_4$+$Sb(OEt)_3$→GeSbTe+$Me_3SiOEt$+$Me_3SiOMe$ $Me_3Si$—Te—$SiMe_3$+$GeF_4$+$SbF_5$→GeSbTe+$Me_3SiF$ $Me_3Si$—Te—$SiMe_3$+$Ge(NMe_2)_4$+$Sb(NMe_2)_3$→GeSbTe+$Me_3SiNMe_2$

In the above reactions, GeSbTe represents a general formula of Germanium Antimony Telluride compounds, wherein the ratio of three elements may differ depending upon the end use.

The sequential liquid based deposition method for depositing GeSbTe films on a substrate from silyltellurium compound, alkoxygermane and alkoxyantimony can be illustrated by the reaction scheme shown below.

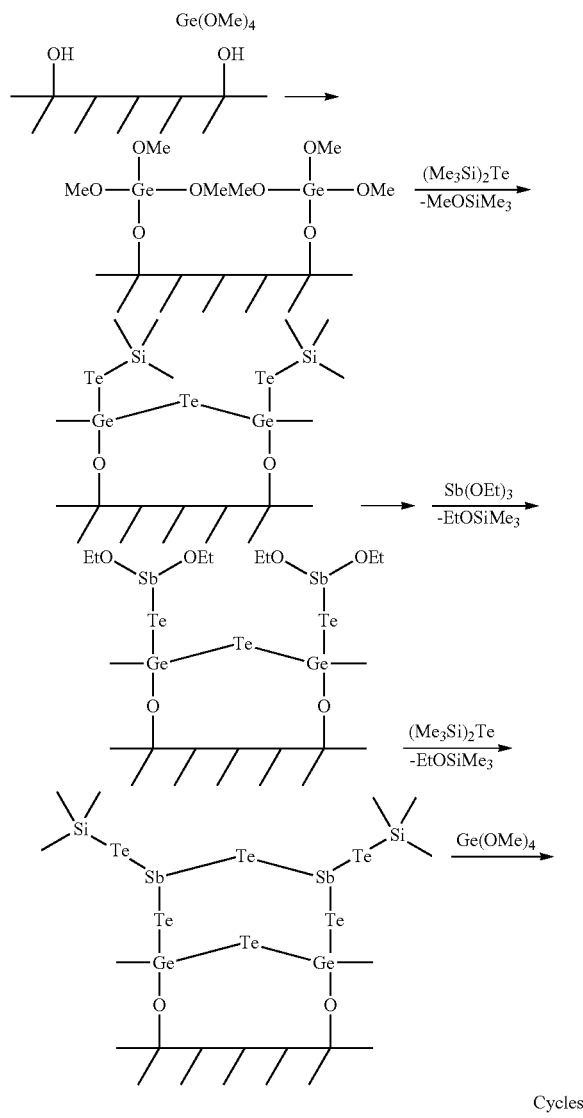

Cycles

In the reaction scheme shown above, rinse steps are not shown because they are used to remove the excess precursor solution from the coating layer. It is believed that the rinse step may avoid excess reaction, such as by the preceding precursor solution and the newly introduced precursor solution, which may generate particles or precipitates on the surface of the coating layer. A similar reaction sequence as that provided above may be adopted for the those embodiments wherein a GeSbSe (Germanium Antimony Selenium) film is deposited using liquid precursors such as silylselenium compound, alkoxygermane, and alkoxyantimony.

In one particular embodiment, the method and/or precursor solution may be used to deposit CdTe materials that are suitable for photovoltaic devices. An example of one method of depositing CdTe materials is shown in the following reaction:

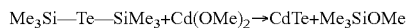

The precursors used herein may be employed as pure liquid compounds if they are liquids under ambient conditions In this or other embodiments, the precursors can be dissolved in a suitable solvent to provide a solution comprising the precursor. In these or other embodiments, the solvent employed in the precursor solution may be any suitable solvent in which the precursor may be dissolved or suspended and which does not impede the deposition such as by causing unwanted side reactions. In certain embodiments, the one or more solvents in the precursor solution exclude oxygen because it may react with silytellurim compounds. Further attributes for solvents to be used herein include one or more of the following: proper boiling point, surface tension, and viscosity to prepare uniform films across 300 mm wafers, gap-fill features, and allow the mixture to adequately wet any passivation layers, such as CVD silicon nitride or silicon oxide. Examples of suitable solvents which may be employed as precursor solvents and/or rinse solvents include, but are not limited to: aliphatic hydrocarbons (e.g., $C_5$-$C_{12}$ aliphatic hydrocarbons such as hexane, heptane, octane, and/or pentane), aromatic hydrocarbons (e.g., $C_6$-$C_{18}$ aromatic hydrocarbons such as benzene, toluene, and/or mesitylene), nitriles, ethers (e.g., dialkyl ethers comprising $C_1$-$C_6$ alkyl moieties or $C_4$-$C_8$ cyclic ethers), and mixtures thereof. Specific solvents which can be advantageously employed herein comprise, but are not limited to, hexane, pentane, heptane, cyclohexane, octane, toluene, and combinations thereof. Further examples of solvents include chlorinated hydrocarbons, ethers, glycol ethers, and mixtures thereof.

In certain embodiments, the precursors used to deposit the metal films are precursor solutions comprising one or more of a particular precursor compound and one or more solvents that provided that the one or more solvents does not react with the precursor compound contained therein. In these or other embodiments, the rinse solvent may be the same solvent as the precursor solution solvent. In other embodiments, the one or more rinse solvent differs from the one or more solvent used in the precursor solution. In one particular embodiments, hydrocarbon solvents such as, for example, hexanes or octane and/or aromatic hydrocarbons such as, for example, may be used as solvents within the liquid precursor solution and/or as the rinse solvent.

In embodiments wherein the precursor is provided as a precursor composition or solution, the amount of solvent(s) present may range from about 0.01 to about 99.9 weight percent or from about 1 to about 50 weight percent, preferably 1 to 10 weight percent.

The solvent employed in the precursor solution and/or the rinse solution has a relatively low boiling point in order for the residual solvent if present to be readily removed. Exemplary boiling point temperatures for the solvents disclosed herein include ranges having any one or more of the following endpoints: 200, 195, 190, 185, 180, 175, 170, 165, 160, 155, 150, 145, 140, 135, 130, 125, 120, 115, 110, 105, 100, 95, 90, 85, 80, 75, 70, 65, 60, 55, 50, 45, 40, 35, 30, 25, and/or 20° C. Examples of particular melting point ranges include, but are not limited to, from about 20 to about 200° C. or from about 50 to about 100° C.

The precursor, precursor composition, precursor solution, and/or rinse solution has a relatively low viscosity in order to permeate high aspect features of a substrate. In one particular embodiment, the precursor composition or solution has a viscosity of 50 centipoise (cP) or less, or 45 cP or less, or 40 cP or less, of 35 cP or less, or 30 cP or less, or 25 cP or less, or 20 cP or less, or 15 cP or less, or a viscosity of 10 cP or less when measured at 25° C.

The substrate may be contacted with the precursor or precursor solution through a variety of methods which may comprise, but are not limited to, immersion in a bath of the liquid precursor, dip-coating, spin-on coating, and spraying the liquid precursor onto the surface of the substrate. The actual conditions of the contacting step (i.e., temperature, time, and the like) may vary over wide ranges and are generally dependent on a variety of factors such as, but not limited to, the nature and amount of residue on the surface of the substrate and the hydrophobicity or hydrophilicity of the substrate surface, etc. The contacting step can be conducted in either a dynamic method such as, for example, a streamline process for applying the liquid precursor(s) over the surface of the substrate or spin-coating; in a static method such as, for example, a puddle rinse or immersing the substrate within a bath containing the liquid precursor(s); or a combination of static and dynamic methods (e.g., immersion in a liquid bath where the bath is agitated). The liquid precursor may also be sprayed onto the surface of the substrate in a dynamic method such as in a continuous process or sprayed onto the surface and allowed to remain there in a static method. The duration of the contacting step, or time of contact of the process solution to the substrate surface, can vary from a fraction of a second to hundreds of seconds. Preferably, the duration can range from 1 to 200 seconds, preferably from 1 to 150 seconds, and more preferably from 1 to 40 seconds. The temperature range for the contacting step can vary from 10 to 100° C. and more preferably from 10 to 40° C.

In certain embodiments, the liquid precursor or precursor solution contacts the substrate using a spin-on deposition method. In one particular embodiment, approximately 2 milliliters of precursor or precursor solution was dispensed through a 0.5 micron Teflon filter directly onto the wafer spinning at 500 rpm for 10 seconds under an inert atmosphere such as, but not limited to, $N_2$ or argon. After dispense was complete, the wafer was rinsed with a solvent such as for example, the solvent comprising the precursor solution if present, and spun to remove excess solvent. This process is continued with one or more additional precursor or precursor solutions to provide the metal film.

In the method and/or precursor composition comprised herein, the liquid precursor or precursor solution may be provided simultaneously, sequentially, or in any combination thereof during the deposition. Alternatively, the precursors may also be provided sequentially by providing a precursor and purging the unadsorbed precursor prior to providing the next precursor on the coating layer surface. Thus, a precursor that has been supplied but not adsorbed may be purged.

As mentioned previously, the method described herein may be used to deposit a metal-containing film onto at least a portion of a substrate. Examples of suitable substrates include but are not limited to, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and conducting metal layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes. With the deposition chemistry described herein, highly conformal films, such as but not limited to, GeSbTe or GeSbSe can be deposited on the surface of substrate materials such as silicon, silicon oxide, silicon nitride, titanium nitride, and titanium oxide.

While the method and precursor compositions have been described in detail and with reference to specific examples and the embodiments thereof, it will be apparent to one skilled in the art that various changes and modifications can be made therein without departing from the spirit and scope thereof.

EXAMPLES

GeTe, SbTe, GeSbTe (GST) films were deposited by the method described herein. Scanning electron microscope (SEM) was used to obtain cross-sectional image and surface morphology of samples. The phase transition properties of samples and films were characterized by Energy Dispersive X-ray Analysis.

Example 1

Deposition of GST Film

Figure 2:
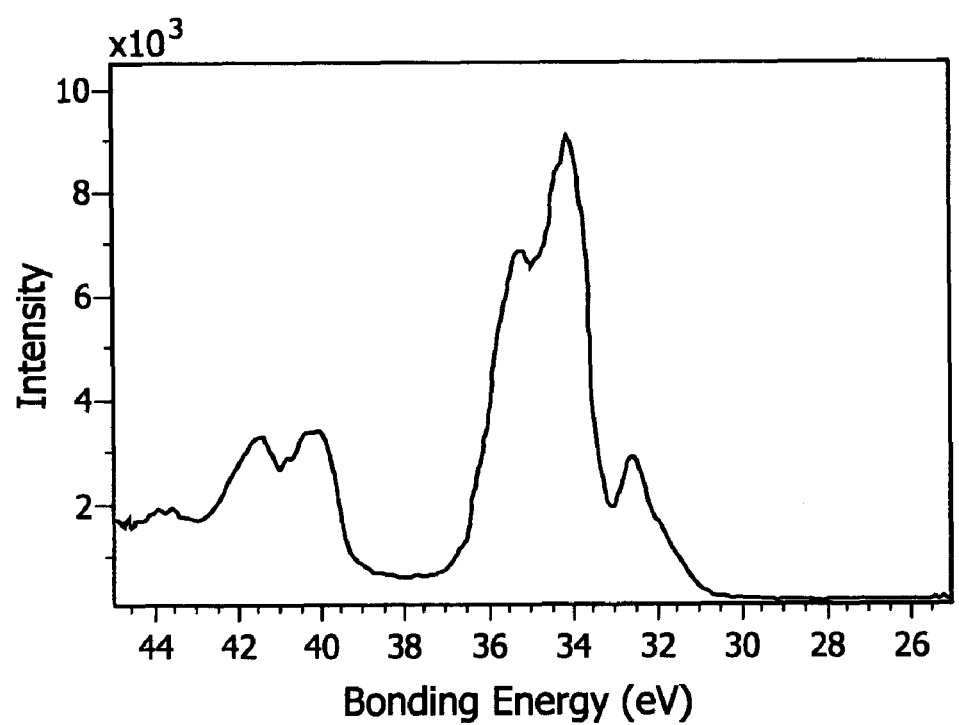
FIG. 2(a). X-ray Photoelectron Spectroscopy (XPS) of GST-Ge Peak of the GST film from FIG. 1.
FIG. 2(b). XPS of GST-Sb Peak of the GST film from FIG. 1.
FIG. 2(c). XPS of GST-Te Peak of the GST film from FIG. 1.
Figure 2:
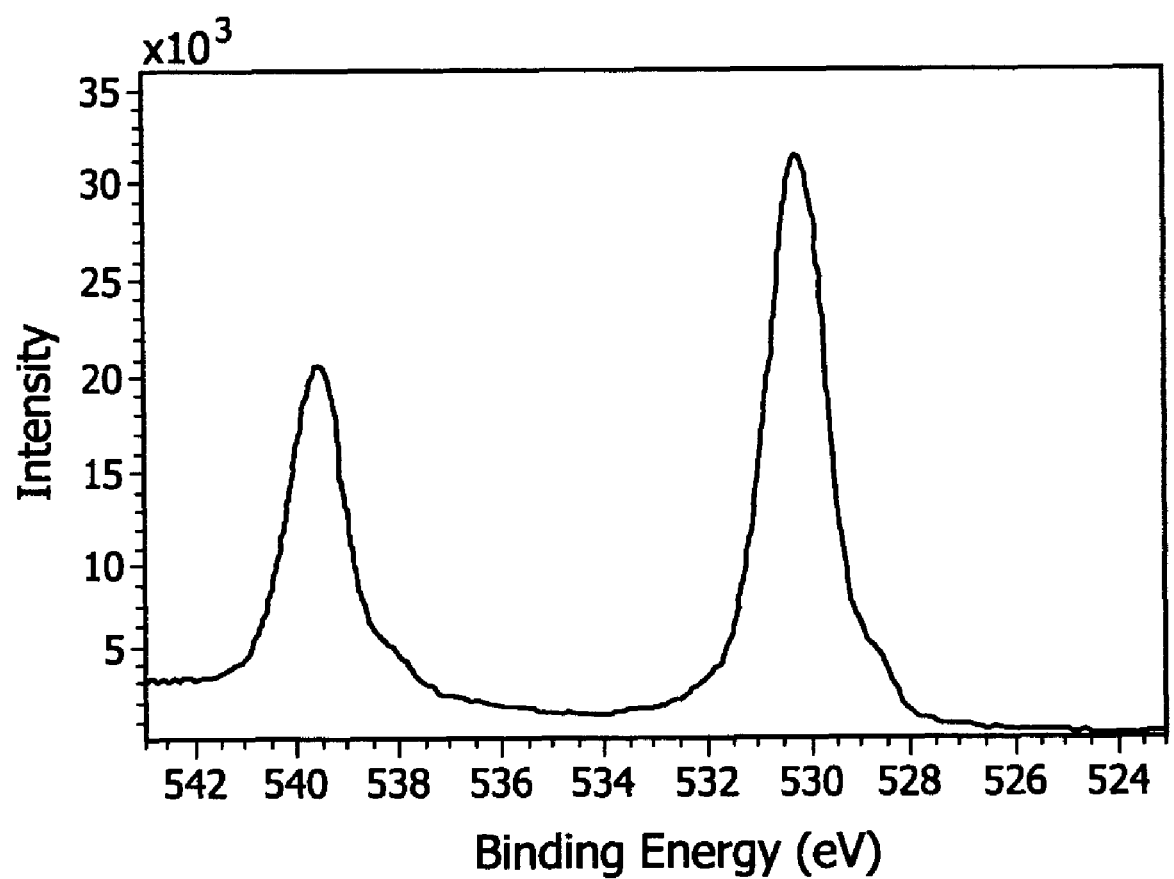
Figure 2:
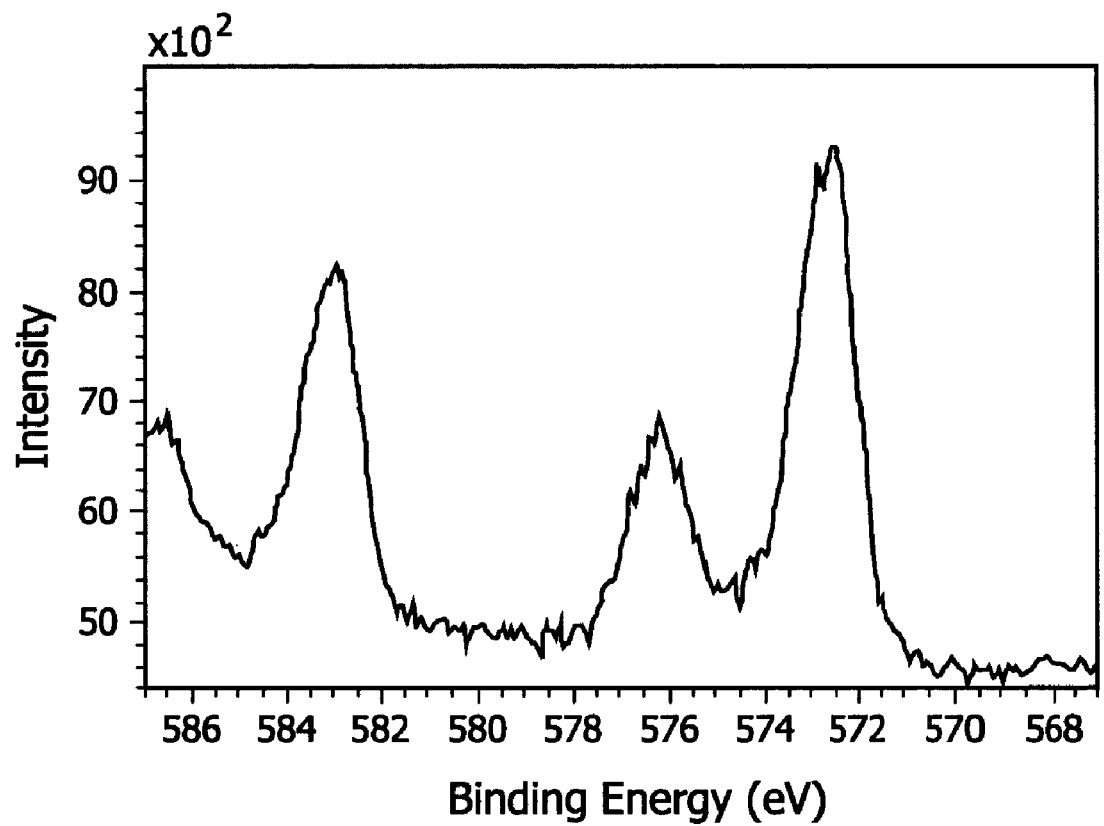

GST was deposited on Si(100) substrates previously coated with 100 nm TiN, because TiN is considered as an electrode or heater material for PCRAM devices. Eight baths were prepared respectively containing:
(1) 5% by weight of a precursor solution comprising $Ge(OMe)_4$ and Hexane
(2) Hexane
(3) 5% by weight of a precursor solution comprising $Te(S-iMe_3)_2$ and Hexane
(4) Hexane
(5) 5% by weight of a precursor solution comprising $Sb(OEt)_3$ and Hexane
(6) Hexane
(7) 5% by weight a precursor solution comprising $Te(S-iMe_3)_2$ and Hexane
(8) Hexane The substrate was dipped in each bath for 3 seconds before being moved on to the next one in turn, and the full cycle was repeated 100 times. The substrate was then dried and the presence of an approximately 100 nanometer (nm) GST film was confirmed by SEM (FIG. 1) and XPS (FIG. 2(a)-(c)).

Example 2

Deposition of Cadmium Telluride (CdTe) Film

Cadmium telluride was deposited on Si(100) substrates. Eight baths were prepared respectively containing:
1. 5% by weight of a precursor solution comprising $Cd(OEt)_2$ and Hexane
2. Hexane
3. 5% by weight of a precursor solution comprising $Te(S-iMe_3)_2$ and Hexane
4. Hexane The substrate was dipped in each bath for 3 seconds before being moved on to the next one in turn, and the full cycle was repeated 100 times. The substrate was then dried.

The aforementioned examples are merely illustrative, and do not limit this disclosure in any way. Other multi-component films including but not limited to Indium Antimony Tellurium (IST), Silver Indium Antimony Tellurium (AIST), Cadmium Telluride (CdTe), Zinc Telluride (ZnTe), Zinc Selenide (ZnSe), Cadium Selenide, Copper indium gallium selenide (CIGS) can be prepared in similar fashion.

The invention claimed is:
1. A method of depositing a multicomponent film on at least a portion of a substrate comprising steps of:

(a) contacting the substrate with an In precursor or a precursor solution comprising the In precursor to react with the substrate to provide a first coating layer comprising In;
(b) rinsing at least a portion of the first coated layer with a rinse solution to remove any unreacted In precursor;
(c) contacting the first coating layer comprising In with a Te precursor or a precursor solution comprising the Te precursor, wherein at least a portion of the Te precursor reacts with the In comprised therein to provide a second coating layer comprising In and Te;
(d) rinsing at least a portion of the second coating layer with rinse solution to remove any unreacted Te precursor;
(e) contacting the second coating layer comprising In and Te with a Sb precursor or a precursor solution comprising the Sb precursor, wherein at least a portion of the Sb precursor reacts with at least a portion of the In and Te comprised therein to provide a third coating layer comprising In, Sb, and Te;
(f) rinsing at least a portion of the third coating layer with rinse solution to remove any unreacted Sb precursor,
(g) contacting the third coating layer comprising In, Te, and Sb with a Te precursor or a precursor solution comprising the Te precursor to react with the third coating layer to provide a fourth coating layer comprising In, Te, and Sb; and
(h) rinsing at least a portion of the fourth coating layer with rinse solution to remove any unreacted Te precursor,
(i) contacting the fourth coating layer comprising In, Te, and Sb with a Ag precursor or a precursor solution comprising the Ag precursor, wherein at least a portion of the Ag precursor reacts with at least a portion of the In, Te, and Sb comprised therein to provide a fifth coating layer comprising In, Te, Sb and Ag;
(j) rinsing at least a portion of the fifth coating layer with rinse solution to remove any unreacted Ag precursor;
(k) contacting the fifth coating layer comprising In, Te, Sb and Ag with a Te precursor or a precursor solution comprising the Te precursor to react with the fifth coating layer to provide a sixth coating layer comprising In, Te, Sb and Ag; and
(l) rinsing at least a portion of the sixth coating layer with rinse solution to remove any unreacted Te precursor, wherein steps (a) through (l) are repeated to form a number of coating layers to provide the film.

2. The method of claim 1 wherein the Ag precursor comprises a compound having the following formula: $MX_n$ wherein M is Ag; X is a nucleophilic group selected from the group consisting of OR (alkoxy), F (fluorine), Cl (chlorine), Br (bromine), $NR_2$ (amino), CN (cyano), OCN (cyanate), SCN (thiocyanate), diketonate, carboxylic groups and mixtures thereof; and n=1 to 3.

3. The method of claim 1 wherein the In precursor comprises a compound having the following formula: $MX_n$ wherein M is In; X is a nucleophilic group selected from the group consisting of OR (alkoxy), F (fluorine), Cl (chlorine), Br (bromine), $NR_2$ (amino), CN (cyano), OCN (cyanate), SCN (thiocyanate), diketonate, carboxylic groups and mixtures thereof; and n=1 to 3.

4. The method of claim 1 wherein the Te precursor comprises a silyltellurium selected from the group consisting of disilyltellurium having a general formula: $(R^1R^2R^3Si)_2Te$; alkylsilyltellurium having a general formula: $(R^1R^2R^3Si)TeR^4$; and mixtures thereof wherein $R^1$, $R^2$, $R^3$, and $R^4$ are each independently selected from the group consisting of: hydrogen; linear, branched, or unsaturated $C_{1-10}$ alkyl groups; $C_{4-10}$ cyclic alkyl groups; and $C_{4-12}$ aromatic groups.

5. The method of claim 1 wherein the Sb precursor comprises a compound having the following formula: $MX_n$ wherein M is Sb; X is a nucleophilic group selected from the group consisting of OR (alkoxy), F (fluorine), Cl (chlorine), Br (bromine), $NR_2$ (amino), CN (cyano), OCN (cyanate), SCN (thiocyanate), diketonate, carboxylic groups and mixtures thereof; and n=3 to 5.

6. The method of claim 1 wherein the at least one of the Ag, the In, the Te, and the Sb precursors in the contacting steps comprises a precursor solution.

7. The method of claim 6 wherein the precursor solution comprises the precursor and at least one solvent selected the group consisting of a hydrocarbon, a halogenated hydrocarbon, and an ether.

8. The method of claim 7 wherein the solvent comprises a hydrocarbon.

9. The method of claim 8 wherein the solvent is at least one selected from the group consisting of hexane, octane, toluene, and combinations thereof.

10. The method of claim 6 wherein the amount of solvent in the precursor solution ranges from about 0.01 to about 90 weight percent.

* * * * *